(12) United States Patent
Dochow et al.

(10) Patent No.: US 11,648,875 B2
(45) Date of Patent: May 16, 2023

(54) AUDIO OUTPUT SYSTEM FOR A VEHICLE

(71) Applicant: Continental Automotive GmbH, Hannover (DE)

(72) Inventors: Gerhard Dochow, Frankfurt am Main (DE); Thomas Göhring, Frankfurt am Main (DE)

(73) Assignee: Continental Automotive GmbH

( * ) Notice: Subject to any disclaimer, the term of this patent is extended or adjusted under 35 U.S.C. 154(b) by 88 days.

(21) Appl. No.: 17/278,460

(22) PCT Filed: Sep. 25, 2019

(86) PCT No.: PCT/EP2019/075852
§ 371 (c)(1),
(2) Date: Mar. 22, 2021

(87) PCT Pub. No.: WO2020/064831
PCT Pub. Date: Apr. 2, 2020

(65) Prior Publication Data
US 2021/0387572 A1    Dec. 16, 2021

(30) Foreign Application Priority Data
Sep. 26, 2018    (DE) .................. 10 2018 216 422.3

(51) Int. Cl.
*B60Q 9/00*    (2006.01)
*G06F 3/16*    (2006.01)
(Continued)

(52) U.S. Cl.
CPC .............. *B60Q 9/00* (2013.01); *G06F 3/165* (2013.01); *G08B 7/00* (2013.01); *H03G 3/3005* (2013.01);
(Continued)

(58) Field of Classification Search
CPC .. B60Q 9/00; G06F 3/165; G08B 7/00; H03G 3/3005; H03G 7/002; H04B 1/082;
(Continued)

(56) References Cited

U.S. PATENT DOCUMENTS 8,159,517 B2    4/2012   Lim et al.
8,299,904 B2 *  10/2012  Konet ................... G10K 15/02
                                                    340/384.1
(Continued)

FOREIGN PATENT DOCUMENTS

DE    102005016917 A1    10/2006
DE    102005061859 A1    7/2007
(Continued)

OTHER PUBLICATIONS

German Examination Report for German Application No. 10 2018 216 422.3, dated Jul. 15, 2019, 7 pages.
International Search Report and Written Opinion for International Application No. PCT/EP2019/075852, dated Jan. 22, 2020, 11 pages.
(Continued)

*Primary Examiner* — Xu Mei
(74) *Attorney, Agent, or Firm* — RatnerPrestia

(57) ABSTRACT

An audio output system for a vehicle. The audio output system includes a volume setting device for setting a volume of an audio signal, an audio input for an audio input signal from an audio source, a warning tone device for providing a warning tone signal, an audio-level measuring device for measuring the audio level at the audio input, and a control unit. The audio-level measuring device is configured to limit the maximum audio level of the audio input signal to a predefined first threshold value as a function of the set volume. The control unit is configured to control an audio output signal on the basis of the warning tone signal, the audio input signal and the set volume, and to output an audible or visual notification if the audio input signal present at the audio input has no audio level.

13 Claims, 2 Drawing Sheets

(51) Int. Cl.
    *G08B 7/00*           (2006.01)
    *H03G 3/30*           (2006.01)
    *H04R 3/00*           (2006.01)
    *H04B 1/08*           (2006.01)

(52) U.S. Cl.
    CPC .............. *H04B 1/082* (2013.01); *H04R 3/00* (2013.01); *H04R 2430/01* (2013.01); *H04R 2499/13* (2013.01)

(58) Field of Classification Search
    CPC .. H04R 3/00; H04R 2430/01; H04R 2499/13; B60R 11/0217
    USPC .................................. 381/86, 104, 107, 109
    See application file for complete search history.

(56) References Cited

U.S. PATENT DOCUMENTS

| | | | |
|---|---|---|---|
| 10,166,916 B2 * | 1/2019 | Bernico | G06Q 40/08 |
| 2012/0288121 A1 | 11/2012 | Matsui et al. | |
| 2017/0132894 A1 * | 5/2017 | Fan | G08B 25/08 |

FOREIGN PATENT DOCUMENTS

| | | |
|---|---|---|
| DE | 102007030070 A1 | 1/2009 |
| JP | 2010041203 A | 2/2010 |
| JP | 2016064734 A | 4/2016 |

OTHER PUBLICATIONS

International Search Report and Written Opinion for International Application No. PCT/EP2019/075852, dated Jan. 22, 2020, 17 pages (German).

* cited by examiner

AUDIO OUTPUT SYSTEM FOR A VEHICLE

CROSS REFERENCE TO RELATED APPLICATIONS

This application is the U.S. National Phase Application of PCT International Application No. PCT/EP2019/075852, filed Sep. 25, 2019, which claims priority to German Patent Application No. 10 2018 216 422.3, filed Sep. 26, 2018, the contents of such applications being incorporated by reference herein.

FIELD OF THE INVENTION

The invention relates to an audio output system for a vehicle, to a vehicle comprising said audio output system, to a method for audio output, to a computer program element, and to a computer-readable storage medium.

BACKGROUND OF THE INVENTION

Audio systems and/or warning systems can be fitted in vehicles. They can be used to entertain and/or inform the user or the driver. In addition, warning tones can be output via the audio system of the vehicle, or warning tones can be fed into the output signal from the audio system. If, however, the user changes the volume while a warning tone is being output, then after the warning-tone output there may be a jump in volume that can startle the driver. It is also possible for the audio system to malfunction, for instance owing to the audio system having a fault or being compromised, as a result of which it is no longer possible for the user to reduce the volume or switch off the audio system.

Moreover, even though the user may be able to adjust the volume, an inaudible or only very quiet audio signal is output. In this case, the user tries to set the volume to maximum and is startled by the sudden audible change in volume when there is a normal source-signal level and normally amplified output, for instance when the user changes the input source.

SUMMARY OF THE INVENTION

An aspect of the invention aims to improve the audio output in a vehicle.

A first aspect relates to an audio output system for a vehicle. The audio output system comprises a volume setting device for setting a volume of an audio signal, an audio input for an audio input signal from an audio source, a warning tone device for providing a warning tone signal, an audio-level measuring device for measuring the audio level at the audio input, and a control unit. The audio-level measuring device is configured to limit the maximum audio level of the audio input signal to a predefined first threshold value as a function of the set volume. The control unit is configured to control, provide and/or output an audio output signal on the basis of the warning tone signal, the audio input signal and the set volume.

By virtue of the audio output system, it is possible to prevent the user being startled by too loud an audio output from the audio system that is a surprise to the user. In other words, it is possible to prevent the audio output signal having too high an audio level. There can be several reasons for the audio output being too loud here. For example, the actual audio signal may be lower or muted because of a warning tone and the user may simultaneously increase the volume via a volume setting device. It should be noted that the volume setting device may be a rotary control, a rotary pushbutton control, a rocker switch or a pushbutton. Thus the previously reduced audio signal may be output at the new level, which is too high, once the warning tone is no longer being output. This may surprise or startle the user. Furthermore, the audio source may have a malfunction that causes an audio output signal to be output at too high an audio level. In addition, an input source may be selected that has no audio level, and the user consequently changes the volume in order to be able to hear an audio output. As soon as the user switches to another input source, this is reproduced at the audio level that is too high. The audio output system described above and below can prevent these audio output signals that have too high an audio level. This audio output system is a "safe" audio output system that has an audio input to which can be connected an audio source, for instance an infotainment system, a radio, a navigation unit, an Internet radio, a streaming service or a CD player. An audio input signal received at the audio input can be measured or analyzed by an audio-level measuring device. This audio-level measuring device can limit the maximum audio level of the audio input signal to a first predefined threshold value if the audio level is too high. The predefined threshold value and determining whether the audio level is too high can be dependent on the set volume. The control unit of the audio output system can receive a warning tone signal from a warning tone device and the audio input signal, which may be limited, and based thereon together with the set volume, can control, generate, provide or output an audio output signal. For example, the warning tone signal can be added onto the audio input signal. Alternatively or additionally, the audio level of the audio input signal can be reduced or muted while the warning tone signal is being output. In addition, the control unit can provide the slow adjustment, after the warning-tone output, of the audio level of the audio output signal to the previous audio level, or can allow only a predefined maximum rate of change of the audio level. Measuring the audio level of the audio input signal and including the set volume can prevent too loud an audio output occurring suddenly that may surprise or startle the user. It is possible here for the audio output system to take into account the difference between the audio levels of the warning tone and of the audio input signal, or a possible malfunction of the audio source or a switchover of the input sources having different audio levels.

It should be noted that the audio input signal may be an analog or digital audio input signal.

It should be noted that the audio-level measuring device can limit the audio level by clipping or capping this at the predefined threshold value; in other words, by setting the audio level that exceeds the threshold value to the value of the threshold value. Alternatively or additionally, the audio input signal can be normalized in accordance with the predefined threshold value. The audio level of the audio input signal can hence be reduced or limited evenly such that a maximum audio level of the audio signal does not exceed the threshold value.

Audio level refers to the output volume or the change in volume of the audio signal that is output (in particular in the case of analog audio signals). The set volume describes the set volume level that is the basis for determining the audio level.

It should be noted that the control unit may be a processing unit, a processor or a circuit. In addition, the control unit can comprise a memory unit for storing data.

Audio sources, for instance sources such as an infotainment system, are becoming increasingly complex and also increasingly vulnerable to attack as a result of connectivity to the Internet. Furthermore, the volume setting by the user can undergo various modifications in the processing of the audio source, for example as a result of taking into account the speed of the vehicle, the source signal level, the amplifier temperature, the source(s) selected by the user, and sources mixed therewith by the audio source, for instance navigation announcements, or the sound level in the vehicle interior, for instance in the case of hands-free equipment.

By virtue of the embodiment described, the audio output system allows a simple functionality which can hence be implemented safely and which prevents an inaudible or unnoticeable volume change by the user, for instance during a warning output at a system volume, or always allows the user to reduce or mute the volume even in the case of a faulty or compromised audio source.

The described solution significantly reduces or entirely avoids the risk that the driver is startled by an unexpected jump in volume or that the driver can no longer reduce the potentially maximum volume as a result of the audio source having a fault or being compromised, without the need to limit the complexity or extensibility of the audio source.

Another advantage arises in combined systems, which already have a safe audio output (for example for warning tones) as part of a certifiably safe subsystem, and an audio-source subsystem that cannot be certified as safe. These systems can be upgraded to the audio output system described above and below with only a small amount of extra effort.

According to one embodiment, the control unit is configured to reduce the maximum audio level of the audio input signal or to mute the audio input signal if the warning tone device is providing a warning tone signal.

In other words, the audio level of the audio input signal is reduced or muted while the warning tone is being output so that the user can hear the warning tone. As soon as the warning tone has ended, the audio input signal can be output again as the audio output signal, and although this may cause a jump in the audio level, this is prevented by the audio output system because the audio level of the audio input signal is measured, and if this is too high, the audio level is suitably limited.

The control unit is configured to output an audible or visual notification if the audio input signal present at the audio input has no audio level.

Should there be no audio level present at the audio input, the control unit can output an audible or visual notification to the user so that the user does not increase the volume and is not startled by a loud audio output when the input source is switched over. The notification can be output to the user here by means of a warning tone, an indicator in a screen, or a warning light.

According to a further embodiment, the control unit is configured to generate an audio reference signal in order to determine the audio output level required by a user.

In other words, the control unit can generate an audio signal for which the user sets his preferred audio level by means of the volume setting device. It is thereby possible to provide the control unit with a reference value for the preferred audio level of the audio output signal.

According to one embodiment, the control unit is configured to compare the audio level measured at the audio input with a standard input level set by the user, and thereby to determine the first predefined threshold value.

The standard input level set by the user can be established by means of the reference signal, for example. Alternatively or additionally, the control unit can determine the standard input level also from the listening habits and appropriate analysis thereof. In other words, the control unit can analyze the audio levels of the output audio outputs and thereby determine the standard input level for the user.

According to one embodiment, the first predefined threshold value is higher than the user-set audio level of the audio input signal.

In other words, the threshold value is not meant to take precedence over the wish of the user but an audio output at too high an audio level is meant to be prevented to avoid startling the user. Thus the threshold value can advantageously lie above the volume set by the user, whereby the audio input signal is limited only if the audio source is malfunctioning or if there were too great a difference between the audio levels of the warning tone and of the audio signal without warning tone.

According to one embodiment, the control unit is configured to limit the rate of change of the audio level of the audio output signal if the audio input signal has been reduced because of a warning tone signal.

In other words, the control unit can limit the rate of change of the maximum audio level, and therefore the audio level cannot be changed sharply in a very short time span, for instance 0.1 s. The user can hence become accustomed to the new audio level because it is increased slowly to the final value on the basis of a ramp function. In other words, the control unit can provide a certain time span, for instance 2 s, from the end of the output of the warning tone signal to the output of the audio input signal at full audio level.

According to a further embodiment, the control unit is configured to limit the audio level of the audio output signal to a second threshold value.

In other words, the control unit can provide a maximum for the audio level, for example in order to protect an amplifier or a loudspeaker. Thus no audio level of the audio output signal can lie above this second predefined threshold value.

According to one embodiment, the audio source comprises a plurality of input sources, for instance a radio, an Internet radio, a CD player, an AUX connection, a Bluetooth interface, a navigation system, or hands-free equipment.

According to one embodiment, the audio output system also comprises a loudspeaker. This loudspeaker is configured to output the audio output signal generated by the control unit.

A further aspect of the invention relates to a vehicle comprising an audio output system described above and below.

For example, the vehicle is a motor vehicle such as a car, a bus or a truck, or else also a rail vehicle, a ship, or an airplane or a helicopter.

A further aspect relates to a method for audio output for a vehicle. The method comprises the following steps:
setting a volume for an audio signal;
measuring an audio level of an audio input signal at an audio input by means of an audio-level measuring device;
limiting by means of the audio-level measuring device the maximum audio level of the audio input signal to a first predefined threshold value as a function of the set volume;
controlling by means of a control unit an audio output signal on the basis of a warning tone signal, the audio input signal and the set volume; and
outputting an audible or visual notification (12) if the audio input signal (55) present at the audio input (31) has no audio level.

A further aspect of the invention relates to a program element that, when executed on a control unit of an audio output system, instructs the audio output system to perform the method described above and below.

A further aspect of the invention relates to a computer-readable storage medium on which a program element is stored which, when executed on a control unit of an audio output system, instructs the audio output system to perform the method described above and below.

Further features, advantages and possible applications of aspects of the invention emerge from the description of the exemplary embodiments and the figures that follows.

BRIEF DESCRIPTION OF THE DRAWINGS

The figures are schematic and not to scale. If the same reference signs are specified in the description of the figures that follows, they denote identical or similar elements.

DETAILED DESCRIPTION OF THE PREFERRED EMBODIMENTS

Figure 1:
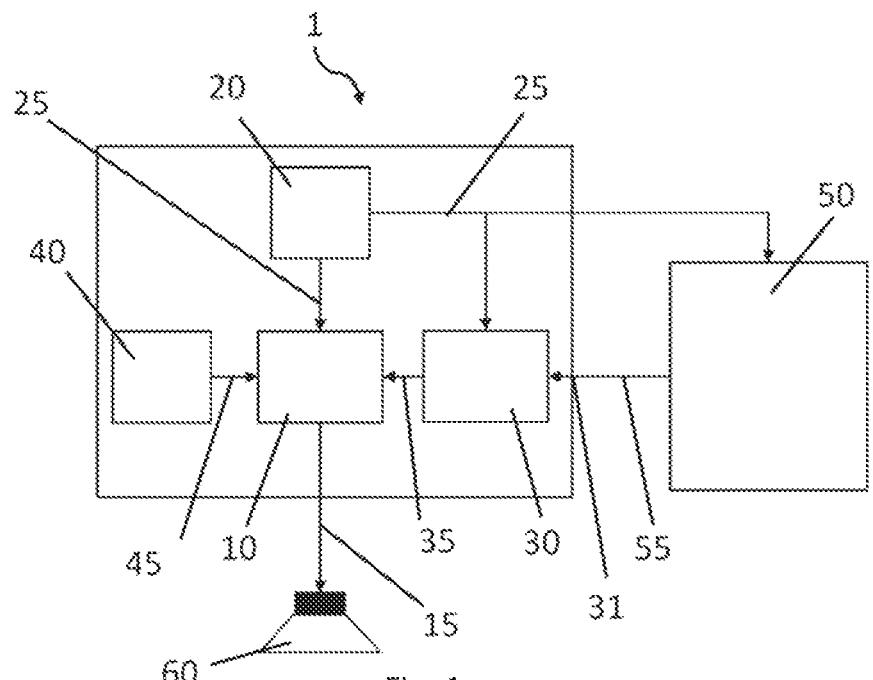
FIG. 1 shows a block diagram of an audio output system according to one embodiment of the invention.

FIG. 1 shows a block diagram of an audio output system 1. The audio output system 1 comprises a control unit 10, a volume setting device 20, an audio-level measuring device 30, an audio input 31 and a warning tone device 40. FIG. 1 also shows an audio source 50 and a loudspeaker 60. The volume setting device 20 can set the volume of an audio signal. For example, the volume setting device 20 may be a rotary control, rocker switches, pushbuttons or a rotary pushbutton control, at which the user can set a required volume. The set volume 25 can be communicated to the control unit 10, to the audio-level measuring device 30 and to the audio source 50, and this can define the value of the audio level. The audio source 50 can provide an audio input signal 55, for instance a radio station, at the audio input 31. It should also be noted that the audio source 50 can comprise a plurality of input sources, for instance a radio, a CD player, an AUX input, an Internet radio, a Bluetooth interface, a navigation unit, hands-free equipment or a streaming service. The audio level of the audio input signal 55 received at the audio input 31 can be measured by the audio-level measuring device 30. In addition, the audio-level measuring device 30 can limit the maximum audio level of the audio input signal 55 to a predefined threshold value. This can be done as a function of the set volume 25. For example, the audio-level measuring device 30 can clip or cap the audio level if the audio level exceeds the preset threshold value. Alternatively or additionally, the audio-level measuring device 30 can normalize the audio level or the audio input signal 55 in accordance with the predefined threshold value in order to reduce this signal accordingly. Measuring the audio level and limiting to a predefined threshold value can also safeguard against any malfunctions of the audio source 50. It may happen, for example, that the audio level of the audio input signal 55 is too high for the set volume, for instance as a result of a malfunction. The audio-level measuring device 30 can detect and accordingly limit this too-high audio level of the audio input signal 55. The predefined threshold value can advantageously be defined above the expected audio level to avoid limiting a fault-free audio input signal 55. In addition, the audio-level measuring device 30 can detect a malfunction of the audio source 50; for instance, as a result of changing the volume setting, there may be the expectation of a reduced audio level of the audio input signal 55 that is not measured, however, in the audio level measurement by the audio-level measuring device 30, and hence a malfunction can be inferred.

The limited audio input signal 35 can also reach the control unit 10. In addition, the warning tone device 40 can output a warning tone signal 45 to the control unit. The control unit 10 can control, provide or output the audio output signal 15 on the basis of the warning tone signal 45 and the limited audio input signal 35, or the audio input signal 55 and the set volume 25. In particular, the control unit 10 can reduce or mute the maximum audio level of the audio input signal 55 if a warning tone signal 45 is being output. It can hence be ensured that the user can hear the warning tone signal 45. In other words, the control unit 10 can feed the warning tone signal 45 into the audio input signal 55. In addition, when there is a switch from the warning tone signal 45 back to the audio input signal 55, the control unit 10 can limit the audio level to avoid the user being startled by the sudden onset of a loud audio signal. For example, the control unit 10 can limit the rate of change of the audio level after a warning tone signal 45 to prevent the audio output signal 15 being suddenly loudly audible. In addition, the control unit 10 can limit the audio level of the audio output signal 15 to a second predefined threshold value. In other words, the audio level of the audio input signal 55 is increased slowly in the audio output signal 15 up to the final value.

The audio output signal 15, which can comprise the warning tone signal 45 and the audio input signal 35, which may be limited, can be output to a user via the loudspeaker 60. Hence warning tones and audio signals can be output via the same audio output system 1, which can reduce weight and installation space.

Figure 2:
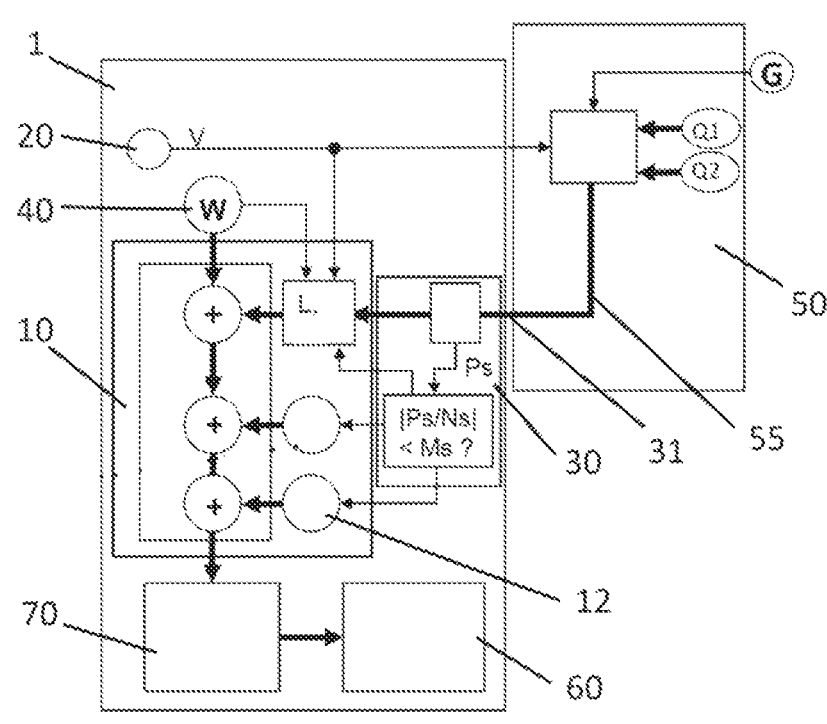
FIG. 2 shows a signal flow diagram of an audio output system according to one embodiment of the invention.

FIG. 2 shows a signal flow diagram of the audio output system 1. The thick arrows represent the audio signals, and the thin arrows represent the control signals. The audio source 50 can comprise a plurality of input sources Q1, Q2. In addition, the volume or the audio level can be adjusted according to a speed G of the vehicle. The audio source 50 can also receive the set volume V from the volume setting device 20. The audio source 50 can generate the audio input signal 55 for the audio output system 1. This audio input signal 50 can be fed into the audio-level measuring device 30 via the audio input 31. The audio-level measuring device 30 can measure the audio level of the audio input signal 55, determine the maximum audio level Ps, and, if applicable, limit the maximum audio level Ps to a predefined threshold value L. The audio level can be limited in particular when the audio level Ps exceeds a certain standard input level Ns by more than a predefined threshold value Ms. The control unit 10 can process the limited audio input signal and a warning tone signal W from a warning tone device 40, and control or output an audio output signal. In addition, the control unit 10 can output an audible or visual notification 12 if the audio input signal 55 present at the audio input 31 has no audio level. The user can thereby be notified that there is currently no audio signal present, and changing the volume V will have no effect on the signal. The user can also be protected from too loud an audio output of the audio signal occurring suddenly during a switchover to another input source Q1, Q2. The audio output signal from the control unit 10 can be amplified in an amplifier 70 before it is output by a loudspeaker 60. It should be noted that the control unit 10 may also already contain the amplifier.

Figure 3:
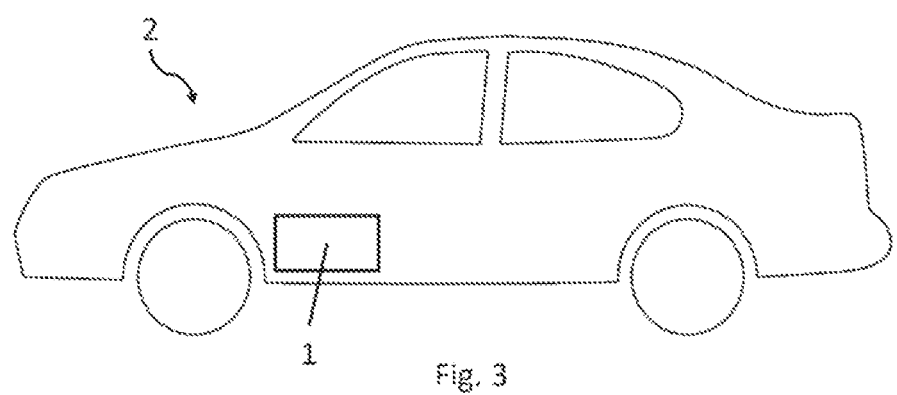
FIG. 3 shows a vehicle having an audio output system according to one embodiment of the invention.

FIG. 3 shows a vehicle 2 comprising an audio system 1 described above and below. Warning tones, an audio input signal from an audio source such as a radio, for instance, a reference signal and/or a notification signal can be output via the audio system 1. In addition, the volume and the audio level of the individual signals can be adjusted in order to be able to provide an optimized audio output signal for the user. For example, a reference signal can be used to set the required audio level, and a notification signal can indicate to the user that the audio input signal currently has no audio level. Moreover, monitoring and any limiting of the audio level of the audio input signal can protect the user from loud audio signals occurring suddenly. The monitoring and limiting of the audio level can also be used to mitigate attacks on the audio source.

Figure 4:
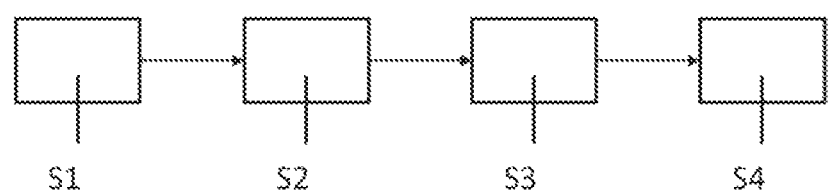
FIG. 4 shows a flowchart for a method for audio output according to one embodiment of the invention.

FIG. 4 shows a flowchart for a method for audio output in a vehicle. In a step S1, a user sets a volume for an audio signal. This setting can be performed, for instance, by means of a volume control such as a rotary pushbutton control, rocker switches, pushbuttons or a rotary knob. In a step S2, an audio-level measuring device measures the audio level of an audio input signal from an audio source. In step S3, the audio-level measuring device can limit the maximum audio level of the audio input signal to a first predefined threshold value as a function of the set volume. In step S4, an audio output signal is controlled on the basis of a warning tone signal, the audio input signal and the set volume. In addition, the maximum audio level of the audio input signal can be reduced or muted while a warning tone signal is being output so that the warning tone signal can be heard better. In step S4, also an audible or visual notification is output if the audio input signal present at the audio input has no audio level.

The invention claimed is:

1. An audio output system for a vehicle, comprising:
   a volume setting device for setting a volume of an audio signal;
   an audio input for providing an audio input signal from an audio source;
   a warning tone device for providing a warning tone signal;
   an audio-level measuring device for measuring an audio level at the audio input; and
   a control unit,
   wherein the audio-level measuring device is configured to limit a maximum audio level of the audio input signal to a predefined first threshold value as a function of a set volume, and
   wherein the control unit is configured to control an audio output signal on the basis of the warning tone signal, the audio input signal and the set volume,
   wherein the control unit is configured to output an audible or visual notification if the audio input signal present at the audio input has no audio level.

2. The audio output system as claimed in claim 1, wherein the control unit is configured to reduce the maximum audio level of the audio input signal or to mute the audio input signal if the warning tone device is providing a warning tone signal.

3. The audio output system as claimed claim 2, wherein the control unit is configured to limit a rate of change of the audio level of the audio output signal if the audio input signal has been reduced because of a warning tone signal.

4. The audio output system as claimed in claim 1, wherein the control unit is configured to generate an audio reference signal in order to determine an audio output level required by a user.

5. The audio output system as claimed in claim 4, wherein the first predefined threshold value is higher than a user-set audio level of the audio input signal.

6. The audio output system as claimed in claim 1, wherein the control unit is configured to compare the audio level measured at the audio input with a standard input level set by the user, and thereby to determine the first predefined threshold value.

7. The audio output system as claimed in claim 6, wherein the first predefined threshold value is higher than the user-set audio level of the audio input signal.

8. The audio output system as claimed in claim 1, wherein the control unit is configured to limit the audio level of the audio output signal to a second threshold value.

9. The audio output system as claimed in claim 1, wherein the audio source comprises a plurality of input sources.

10. A vehicle comprising an audio output system as claimed in claim 1.

11. A method for audio output for a vehicle, comprising:
    setting a volume for an audio signal;
    measuring an audio level of an audio input signal at an audio input by an audio-level measuring device;
    limiting by the audio-level measuring device a maximum audio level of the audio input signal to a first predefined threshold value as a function of a set volume;
    controlling an audio output signal based on a warning tone signal, the audio input signal and the set volume; and
    outputting an audible or visual notification if the audio input signal present at the audio input has no audio level.

12. A non-transitory computer program element which, when executed on a control unit of an audio output system, instructs the audio output system to carry out the method as claimed in claim 11.

13. A non-transitory computer-readable storage medium on which the computer program element as claimed in claim 12 is stored.

* * * * *